US008659149B2

(12) United States Patent
French et al.

(10) Patent No.: US 8,659,149 B2
(45) Date of Patent: Feb. 25, 2014

(54) SEMICONDUCTOR STRUCTURE WITH GALVANIC ISOLATION

(75) Inventors: William French, San Jose, CA (US); Peter J. Hopper, San Jose, CA (US); Ann Gabrys, Santa Clara, CA (US)

(73) Assignee: National Semiconductor Corporation, Santa Clara, CA (US)

(*) Notice: Subject to any disclaimer, the term of this patent is extended or adjusted under 35 U.S.C. 154(b) by 364 days.

(21) Appl. No.: 13/205,823

(22) Filed: Aug. 9, 2011

(65) Prior Publication Data
US 2013/0037909 A1 Feb. 14, 2013

(51) Int. Cl.
*H01L 23/34* (2006.01)

(52) U.S. Cl.
USPC ..... 257/725; 257/784; 257/786; 257/E25.027

(58) Field of Classification Search
USPC ............ 257/725, 784, 786, E25.027
See application file for complete search history.

(56) References Cited

U.S. PATENT DOCUMENTS

| 8,378,776 | B1 * | 2/2013 | Gabrys et al. | 336/200 |
| 8,519,506 | B2 * | 8/2013 | Hopper et al. | 257/499 |
| 2011/0269295 | A1 * | 11/2011 | Hopper et al. | 438/458 |
| 2012/0002377 | A1 * | 1/2012 | French et al. | 361/748 |

OTHER PUBLICATIONS

U.S. Appl. No. 12/827,316, filed Jun. 30, 2010 to William French et al.

* cited by examiner

*Primary Examiner* — Minh-Loan T Tran
(74) *Attorney, Agent, or Firm* — Eugene C. Conser; Wade J. Brady, III; Frederick J. Telecky, Jr.

(57) ABSTRACT

Galvanic isolation between a high-voltage die and a low-voltage die in a multi-die chip is provided by a galvanic isolation die that physically supports the high-voltage die and the low-voltage die, and provides capacitive structures with high breakdown voltages that allow the high-voltage die to capacitively communicate with the low-voltage die.

20 Claims, 17 Drawing Sheets

US 8,659,149 B2

SEMICONDUCTOR STRUCTURE WITH GALVANIC ISOLATION

BACKGROUND OF THE INVENTION

1. Field of the Invention

The present invention relates to semiconductor structures and, more particularly, to a semiconductor structure with galvanic isolation.

2. Description of the Related Art

Galvanic isolation refers to an isolation that prevents a first system from communicating with a second system by way of a flow of electrons from one system to the other system, but which allows the two systems to communicate in other ways. For example, the first system can transmit a signal to the second system using changes in inductance or capacitance, or by using optical or other means.

Galvanic isolation is typically implemented with a dielectric layer that lies between and electrically isolates a first conductor, such as the first coil of a transformer or the first plate of a capacitor, and a second conductor, such as the second coil of the transformer or the second plate of the capacitor. Galvanic isolation is commonly used in multi-die chips that operate with different ground potentials and require a large isolation voltage, such as $5000V_{RMS}$.

FIG. 1 shows a plan view that illustrates an example of a prior-art, galvanically-isolated, multi-die chip 100. As shown in FIG. 1, chip 100 includes a lead frame 110 that has a high-voltage die attach pad or paddle (DAP) 112, and a low-voltage DAP 114 that is electrically isolated from high-voltage DAP 112. Conventional two-DAP lead frames commonly have a DAP-to-DAP spacing X of 0.5 mm.

As further shown in FIG. 1, multi-die chip 100 also includes a high-voltage die 120 that has high-voltage circuitry and signals, a galvanic isolation die 122, and a low-voltage die 124 that has low-voltage circuitry and signals. High-voltage die 120 and galvanic isolation die 122 are both physically connected to DAP 112 of lead frame 110, while low-voltage die 124 is physically connected to DAP 114 of lead frame 110.

In the present example, galvanic isolation die 122 utilizes changes in capacitance to transmit signals and, as a result, includes a capacitor for each signal to be transmitted. (Only one signal path or channel and one capacitor are shown for clarity.) Each capacitor, in turn, includes a high-voltage plate 130 that is electrically connected to a corresponding bond pad BP on high-voltage die 120 by way of a bonding wire BW, a low-voltage plate 132 that is electrically connected to a corresponding bond pad BP on low-voltage die 124 by way of a bonding wire BW, and a dielectric layer 134 that lies between and touches high-voltage plate 130 and low-voltage plate 132. In the present example, dielectric layer 134 can withstand a plate 130-to-plate 132 voltage difference of $5000V_{RMS}$ without suffering dielectric breakdown.

In operation, high-voltage die 120 transmits data to low-voltage die 124 by encoding the data, and then placing encoded data signals in the form of pulses, RF waveforms, or glitches onto high-voltage plate 130. The signals are capacitively coupled to low-voltage plate 132, and are then detected and decoded by low-voltage die 124. (Alternately, capacitor die 122 could be replaced with a die having a transformer.)

One of the drawbacks of multi-die chip 100 is that a two-DAP lead frame requires a custom frame design, which is expensive and complicates the build process when compared to a standard single-DAP lead frame. Another drawback of multi-die chip 100 is that a two-DAP lead frame can be larger than a single-DAP lead frame. Thus, there is a need for an approach to providing galvanic isolation in a multi-die chip.

BRIEF DESCRIPTION OF THE DRAWINGS

FIG. 2A is a plan view. FIG. 2B is a cross-sectional view taken along lines 2B-2B of FIG. 2A. FIG. 2C is a cross-sectional view taken along lines 2B-2B of FIG. 2A.

FIG. 3A is a plan view. FIG. 3B is a cross-sectional view taken along lines 3B-3B of FIG. 3A. FIG. 3C is a cross-sectional view taken along lines 3B-3B of FIG. 3A.

FIG. 4A is a plan view. FIG. 4B is a cross-sectional view taken along lines 4B-4B of FIG. 4A. FIG. 4C is a cross-sectional view taken along lines 4B-4B of FIG. 4A.

DETAILED DESCRIPTION OF THE INVENTION

Figure 1:
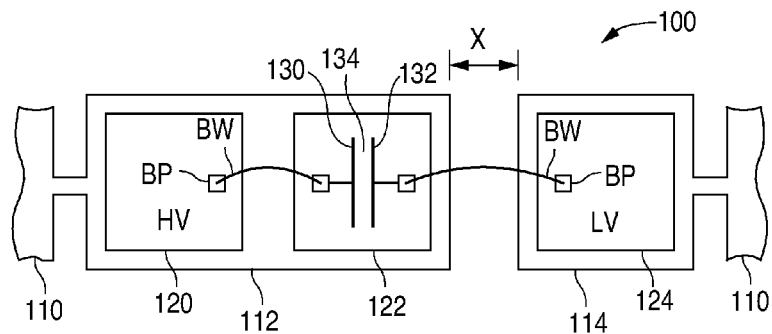
FIG. 1 is a plan view illustrating an example of a prior-art, galvanically-isolated, multi-die chip 100.
Figure 2A:
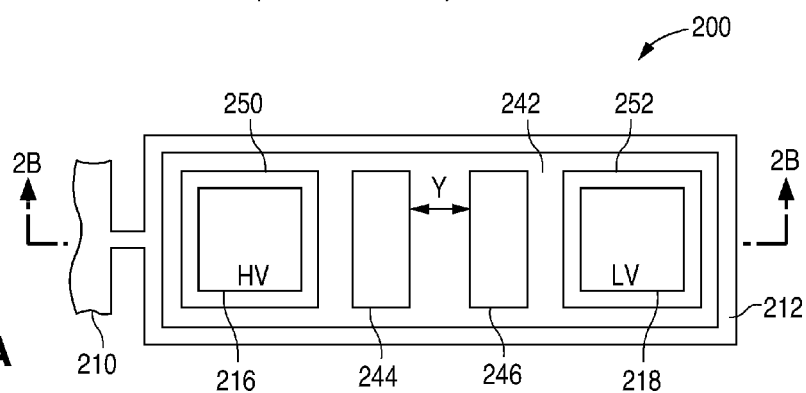
FIGS. 2A-2C are views illustrating examples of a galvanically-isolated, multi-die chip 200 in accordance with the present invention.
Figure 2B:
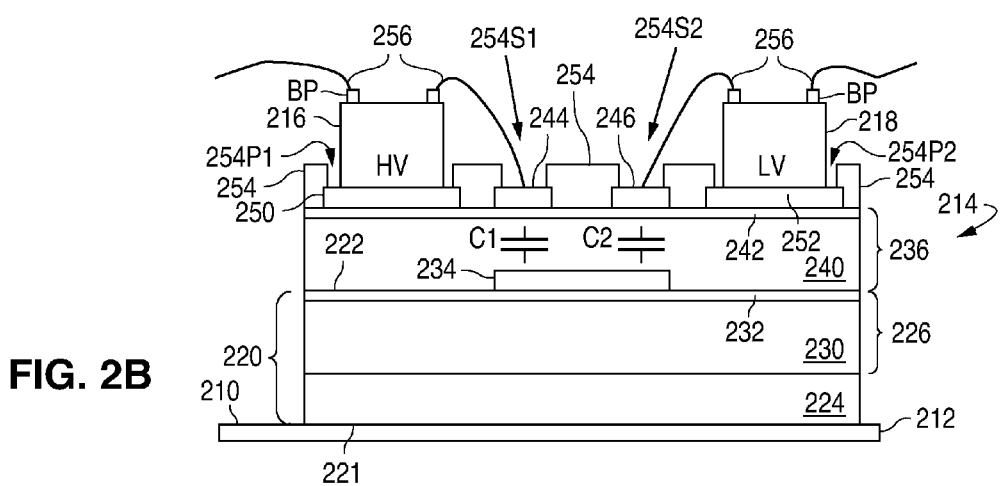
Figure 2C:
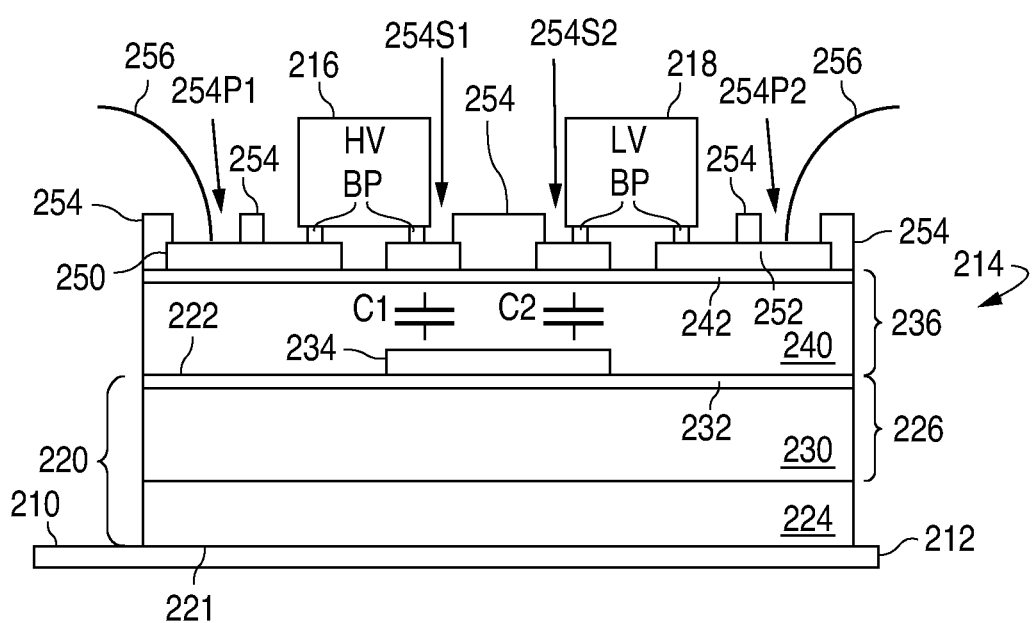

FIGS. 2A-2C show views that illustrate examples of a galvanically-isolated, multi-die chip 200 in accordance with the present invention. FIG. 2A shows a plan view, while FIG. 2B and FIG. 2C each shows a cross-sectional view taken along lines 2B-2B of FIG. 2A. As described in greater detail below, the present invention provides galvanic isolation between a high-voltage die and a low-voltage die by utilizing a galvanic isolation die that physically supports the high-voltage die and the low-voltage die, and also provides capacitive structures with high breakdown voltages that allow the high-voltage die to capacitively communicate with the low-voltage die.

As shown in FIGS. 2A-2C, multi-die chip 200 includes a lead frame 210 which has a single DAP 212, and a galvanic isolation die 214 that is physically connected to DAP 212. Galvanic isolation die 214 can be physically connected to DAP 212 using, for example, a conductive or non-conductive epoxy or die attach film. In addition, multi-die chip 200 includes a high-voltage die 216 and a low-voltage die 218 that are connected to galvanic isolation die 214. High-voltage die 216 and low-voltage die 218, in turn, each have a number of bond pads BP.

In a first embodiment, as shown in FIG. 2B, the bottom surfaces of high-voltage die 216 and low-voltage die 218 are physically connected to galvanic isolation die 214, while the bond pads BP on high-voltage die 216 and the bond pads BP on low-voltage die 218 are electrically connected to galvanic isolation die 214. High-voltage die 216 and low-voltage die 218 can both be physically connected to galvanic isolation die 214 using, for example, a conductive or non-conductive epoxy or die attach film.

Alternately, in a second embodiment, as shown in FIG. 2C, high-voltage die 216 and low-voltage die 218 can be connected to galvanic isolation die 214 as flip chips such that the bond pads BP on high-voltage die 216 and the bond pads BP on low-voltage die 218 are electrically connected to galvanic isolation die 214. In a flip chip mounting, a conductive material, such as solder, provides both electrical and physical connection to galvanic isolation die 214.

As further shown in FIGS. 2A-2C, galvanic isolation die 214 includes a substrate structure 220 which has a bottom surface 221 and a top surface 222. In the present example, top surface 222 is completely non-conductive such that no conductive structure both lies above top surface 222 and touches a conductive region that touches and lies below top surface 222.

As illustrated, substrate structure 220 can be implemented with a silicon substrate 224 and a non-conductive layer 226 that touches the top surface of silicon substrate 224. Non-conductive layer 226, in turn, can be implemented with, for example, a silicon dioxide layer 230 that touches the top surface of silicon substrate 224, and a silicon nitride layer 232 that touches the top surface of oxide layer 230. Nitride layer 232 protects oxide layer 230 from moisture degradation.

As an alternative to a non-conductive layer that overlies a substrate material, other materials with non-conductive top surfaces, such as glass (quartz, borosilicate glass (BSG), and diamond), can also be used to implement substrate structure 220. One advantage of silicon over glass is that a silicon substrate can be easily back ground to accommodate different package size limitations. One advantage of glass over silicon is that glass eliminates parasitic coupling and loses associated with a conductive substrate.

Galvanic isolation die 214 also includes a lower plate 234 that touches the non-conductive top surface 222 of substrate structure 220, and a dielectric layer 236 that touches lower plate 234 and the non-conductive top surface 222 of substrate structure 220. In the present example, lower plate 234 is metal, and dielectric layer 236 includes a silicon dioxide layer 240 that touches the non-conductive top surface 222 of substrate structure 220, and a silicon nitride layer 242 that touches the top surface of oxide layer 240. Nitride layer 242 protects oxide layer 240 from moisture degradation. Further, in the embodiments illustrated in FIGS. 2A-2C, lower plate 234 is electrically isolated from all other conductive structures.

As also shown in FIGS. 2A-2C, galvanic isolation die 214 includes a high-voltage upper plate 244 that touches the top surface of dielectric layer 236 and lies directly vertically over a first portion of lower plate 234, and a low-voltage upper plate 246 that touches the top surface of dielectric layer 236 and lies directly vertically over a second portion of lower plate 234. High-voltage upper plate 244 and low-voltage upper plate 246 are metal, and laterally (horizontally) spaced apart from each other by a separation distance Y.

Galvanic isolation die 214 additionally includes a high-voltage pad 250 and a low-voltage pad 252 that touch the top surface of dielectric layer 236. High-voltage pad 250 and low-voltage pad 252 are metal, and laterally spaced apart from each other as well as from high-voltage upper plate 244 and low-voltage upper plate 246.

As also shown in FIGS. 2A-2C, galvanic isolation die 214 includes a passivation layer 254 that touches the top surface of dielectric layer 236, the plates 244 and 246, and the pads 250 and 252 to prevent moisture from diffusing into galvanic isolation die 214. In the first embodiment, as shown in FIG. 2B, passivation layer 254 has plate openings 254S1 and 254S2 and pad openings 254P1 and 254P2 that expose the plates 244 and 246 and the pads 250 and 252, respectively. In the second embodiment, plate openings 254S1 and 254S2 expose both the plates 244 and 246 and the pads 250 and 252, while the pad openings 254P1 and 254P2 expose only the pads 250 and 252, respectively.

As additionally shown in FIGS. 2A-2C, multi-die chip 200 includes a number of bonding wires 256. In the first embodiment shown in FIG. 2B, the bonding wires 256 electrically connect one or more bonding pads BP on high-voltage die 216 to high-voltage upper plate 244, and one or more bonding pads BP on low-voltage die 218 to low-voltage upper plate 246. Further, the bonding wires 256 connect the remaining bonding pads BP on high-voltage die 216 and low-voltage die 218 to external connection structures (e.g., pins or pads) on lead frame 210. In the second embodiment shown in FIG. 2C, the bonding wires 256 only connect the bond pads BP on high-voltage die 216 and the bond pads BP on low-voltage die 218 to external connection structures (e.g., pins or pads) on lead frame 210 by way of pads 250 and 252, respectively.

In operation, high-voltage die 216 transmits data to low-voltage die 218 by encoding the data, and then placing encoded data signals in the form of pulses, RF waveforms, or glitches onto high-voltage upper plate 244. As illustrated by the capacitor symbols C1 and C2 in FIG. 2B, the signals on high-voltage upper plate 244 are capacitively coupled to lower plate 234, and the signals on lower plate 234 are capacitively coupled to low-voltage upper plate 246. The signals on low-voltage upper plate 246 are then detected and decoded by low-voltage die 218.

To withstand a voltage difference of $5000V_{RMS}$ between high-voltage upper plate 244 and low-voltage upper plate 246, the thickness of dielectric layer 236 must be sufficient to withstand one-half of the total voltage difference (e.g., $2500V_{RMS}$) without dielectric breakdown. Dielectric layer 236 need only withstand one-half of the total voltage difference because one-half of the voltage ($2500V_{RMS}$) is supported by capacitor C1 and one-half of the voltage ($2500V_{RMS}$) is supported by capacitor C2.

In addition, the lateral separation distance Y must be sufficient to prevent lateral dielectric breakdown in two instances. The first instance is so that the molding compound which is used to encapsulate lead frame 210, galvanic isolation die 214, high-voltage die 216, low-voltage die 218, and the bonding wires 256 can withstand the total voltage difference (e.g., $5 KV_{RMS}$) without dielectric breakdown. The second instance is to prevent lateral breakdown between high-voltage plate 244 and low-voltage plate 246 through an overlying passivation layer and/or mold compound.

One of the advantages of multi-die chip 200 over prior-art multi-die chip 100 is that multi-die chip 200 utilizes a standard single-DAP lead frame. As a result, multi-die chip 200 requires no additional area and eliminates the need and expense associated with obtaining a custom designed lead frame.

Figure 3A:
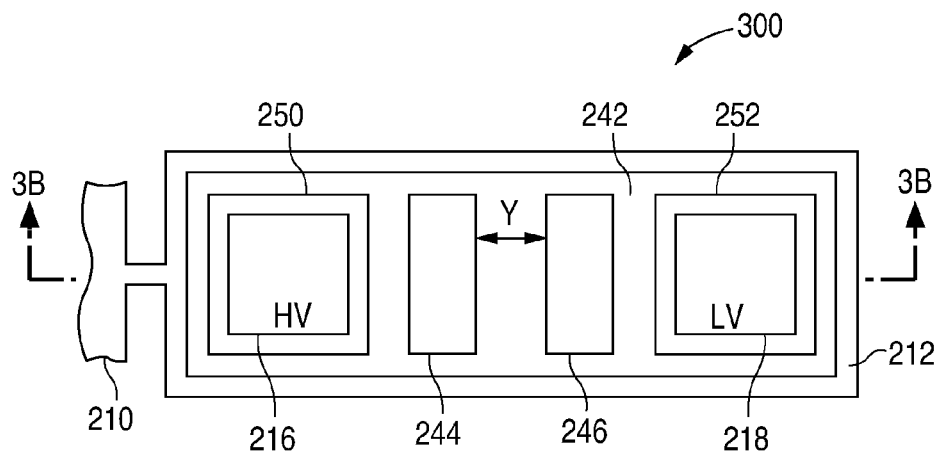
FIGS. 3A-3C are views illustrating examples of a galvanically-isolated, multi-die chip 300 in accordance with a first alternate embodiment of the present invention.
Figure 3B:
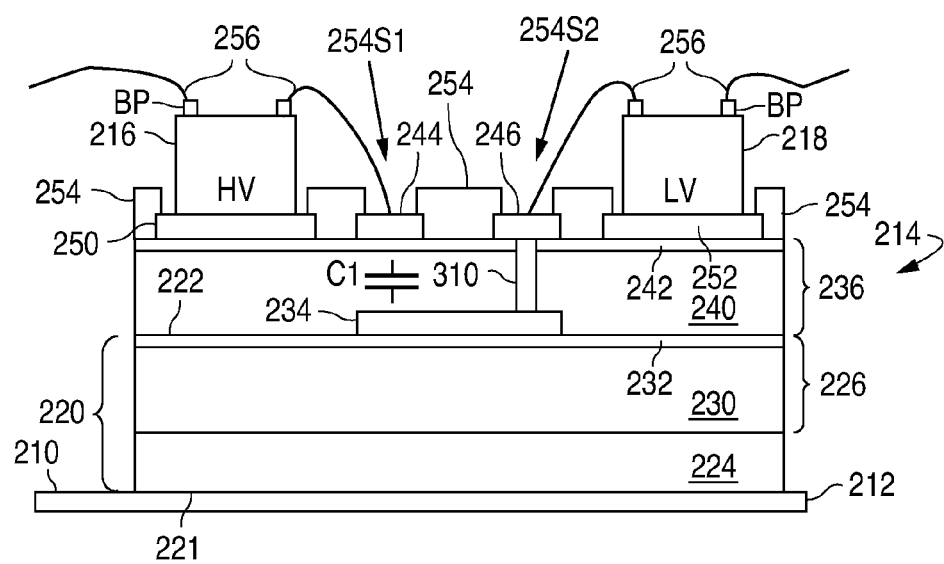
Figure 3C:
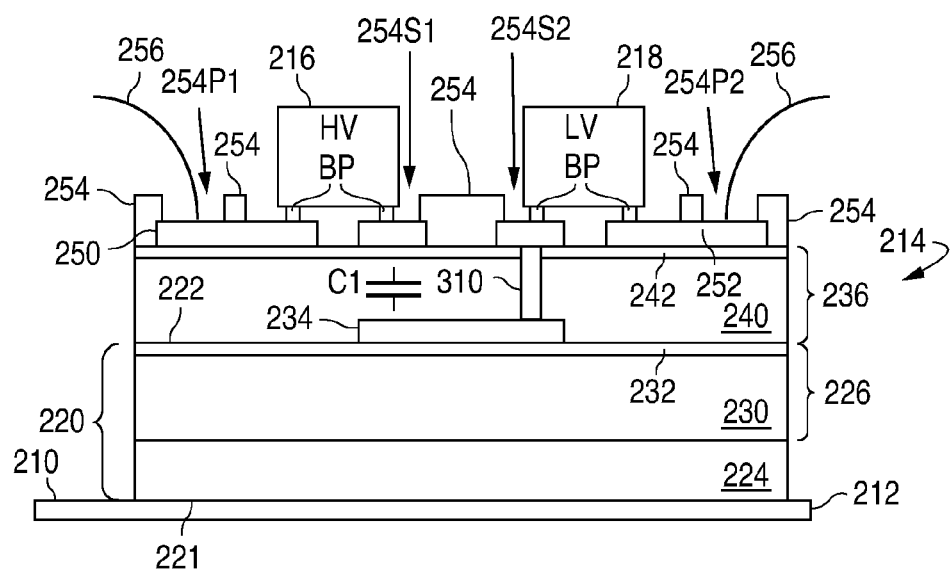

FIGS. 3A-3C show views that illustrate examples of a galvanically-isolated, multi-die chip 300 in accordance with a first alternate embodiment of the present invention. FIG. 3A shows a plan view, while FIGS. 3B and 3C each shows a cross-sectional view taken along lines 3B-3B of FIG. 3A. Multi-die chip 300 is similar to multi-die chip 200 and, as a result, utilizes the same reference numerals to designate the structures which are common to both chips.

As shown in FIGS. 3A-3C, multi-die chip 300 differs from multi-die chip 200 in that multi-die chip 300 has a number of vias 310 that extend through dielectric layer 236 to electrically connect lower plate 234 to low-voltage upper plate 246. In addition, the thickness of dielectric layer 236 must be sufficient to withstand the total voltage difference (e.g., 5 KV) without dielectric breakdown because capacitor C2 has been eliminated. Alternately, capacitor C1 can be eliminated in place of capacitor C2 by using the vias 310 to electrically connect metal lower plate 234 to high-voltage metal upper plate 244.

In operation, high-voltage die 216 transmits data to low-voltage die 218 by encoding the data, and then placing encoded data signals in the form of pulses, RF waveforms, or glitches onto high-voltage upper plate 244. As illustrated by the capacitor symbol C1 in FIG. 3B, the signals on high-voltage upper plate 244 are capacitively coupled to lower plate 234, which are directly coupled to low-voltage upper plate 246 by way of the vias 310. The signals on low-voltage upper plate 246 are then detected and decoded by low-voltage die 218.

One of the advantages of multi-die chip 300 over multi-die chip 200 is that galvanic isolation die 214 of multi-die chip 300 is smaller than galvanic isolation die 214 of multi-die chip 200. In addition, another advantage of multi-die chip 300 over multi-die chip 200 is that galvanic isolation die 214 of multi-die chip 300 removes any issues with electrically floating lower plate 234.

Figure 4A:
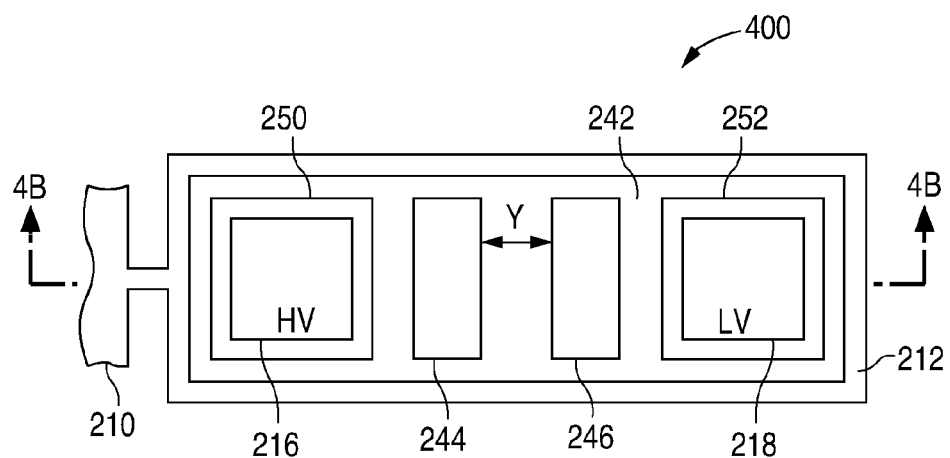
FIGS. 4A-4C are views illustrating examples of a galvanically-isolated, multi-die chip 400 in accordance with a second alternate embodiment of the present invention.
Figure 4B:
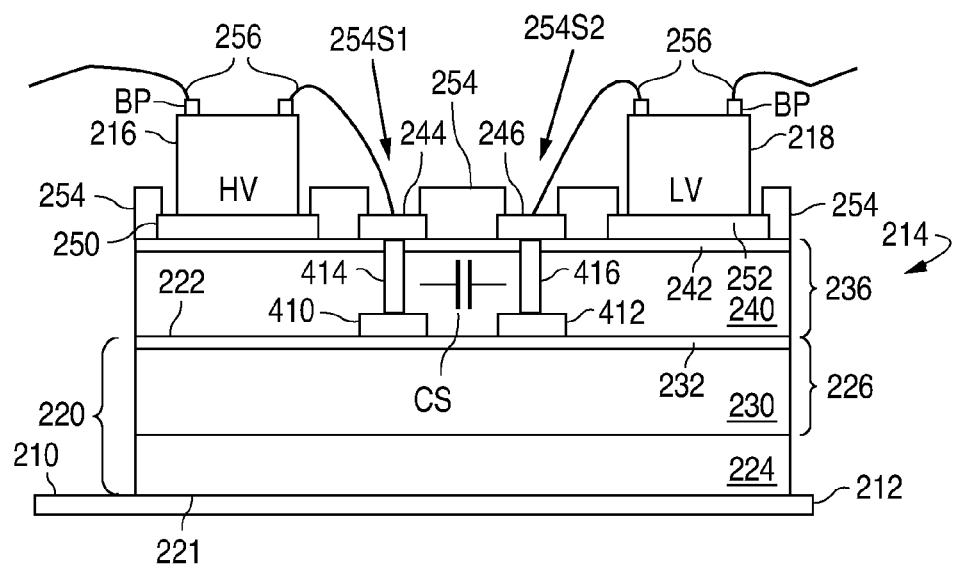
Figure 4C:
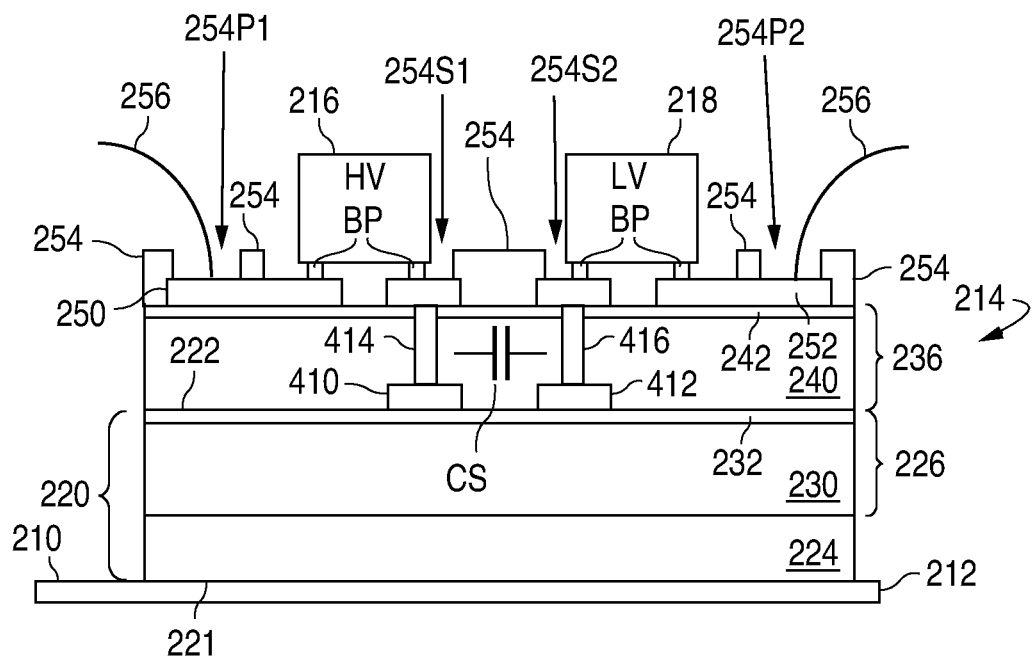

FIGS. 4A-4C show views that illustrate examples of a galvanically-isolated, multi-die chip 400 in accordance with a second alternate embodiment of the present invention. FIG. 4A shows a plan view, while FIGS. 4B and 4C each shows a cross-sectional view taken along lines 4B-4B of FIG. 4A. Multi-die chip 400 is similar to multi-die chip 200 and, as a result, utilizes the same reference numerals to designate the structures which are common to both chips.

As shown in FIGS. 4A-4C, multi-die chip 400 differs from multi-die chip 200 in that multi-die chip 400 utilizes laterally spaced apart metal lower plates 410 and 412 in lieu of lower plate 234. In addition, multi-die chip 400 has a number of metal vias 414 that extend through dielectric layer 236 to electrically connect lower plate 410 to high-voltage upper plate 244, and a number of vias 416 that extend through dielectric layer 236 to electrically connect lower plate 412 to low-voltage upper plate 246.

In operation, high-voltage die 216 transmits data to low-voltage die 218 by encoding the data, and then placing encoded data signals in the form of pulses, RF waveforms, or glitches onto high-voltage upper plate 244, the vias 414, and lower plate 410. As illustrated by the capacitor symbol CS in FIGS. 4B and 4C, the signals on high-voltage upper plate 244, the vias 414, and lower plate 410 are capacitively coupled to low-voltage upper plate 246, the vias 416, and lower plate 412. The signals on low-voltage upper plate 246 are then detected and decoded by low-voltage die 218.

One of the advantages of multi-die chip 400 over multi-die chip 200 is that the capacitance per unit area of multi-die chip 400 is often denser than the capacitance per unit area of multi-die chip 200. In addition, the thickness of dielectric layer 236 can be significantly reduced because the electric field is no longer vertical, but is now horizontal.

Figure 5A:
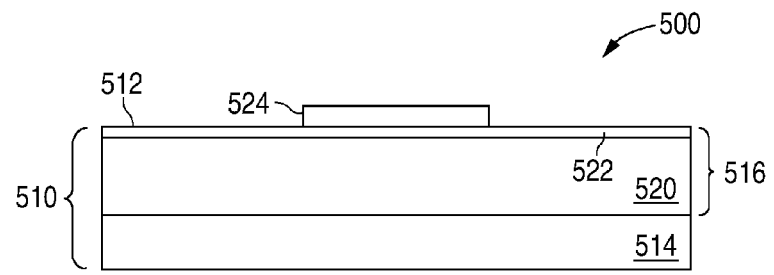
FIGS. 5A-5U are cross-sectional views illustrating examples of a method 500 of forming multi-die chip 200 in accordance with the present invention.
Figure 5B:
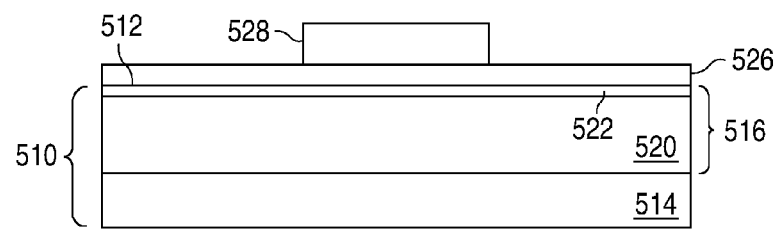
Figure 5C:
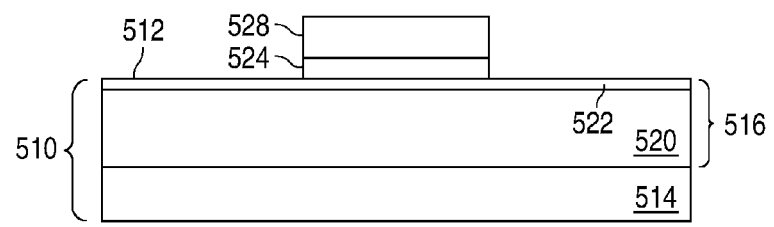
Figure 5D:
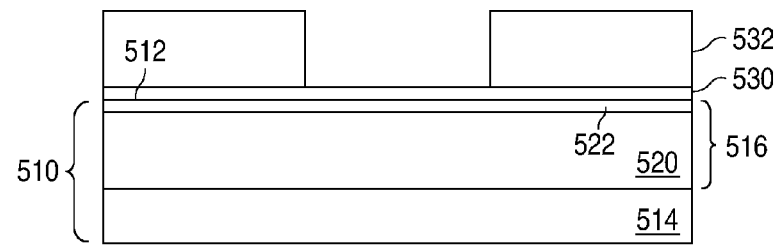
Figure 5E:
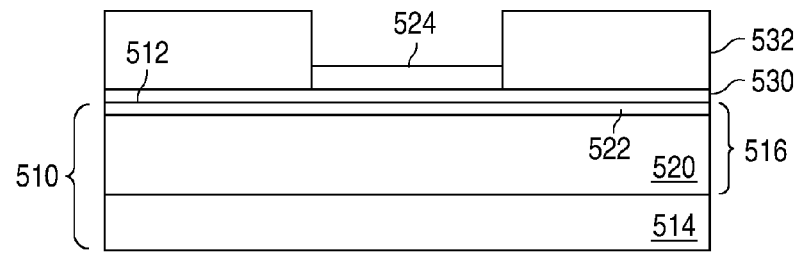
Figure 5F:
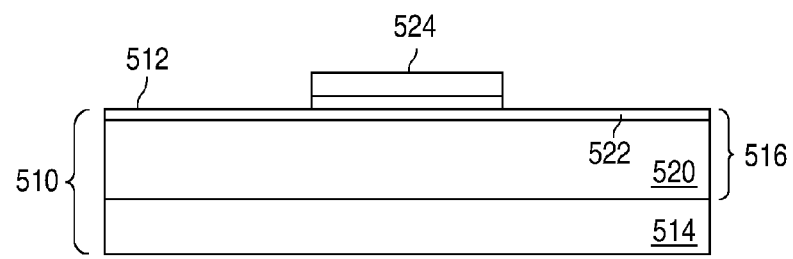
Figure 5G:
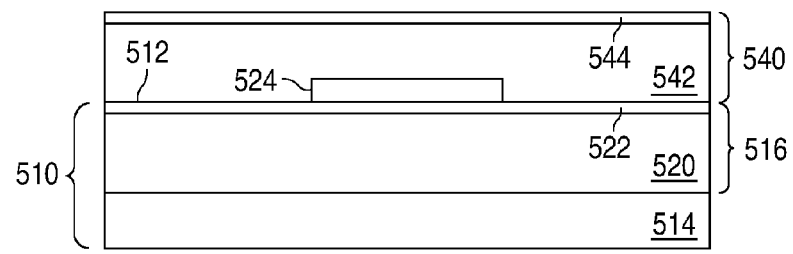
Figure 5H:
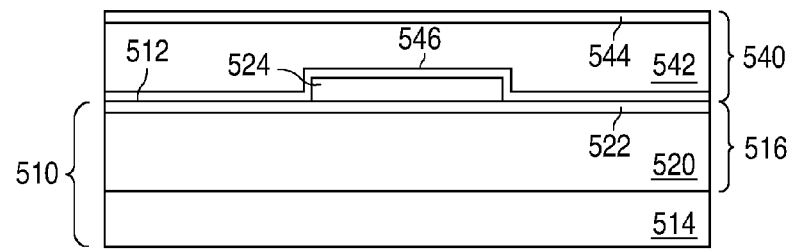
Figure 5I:
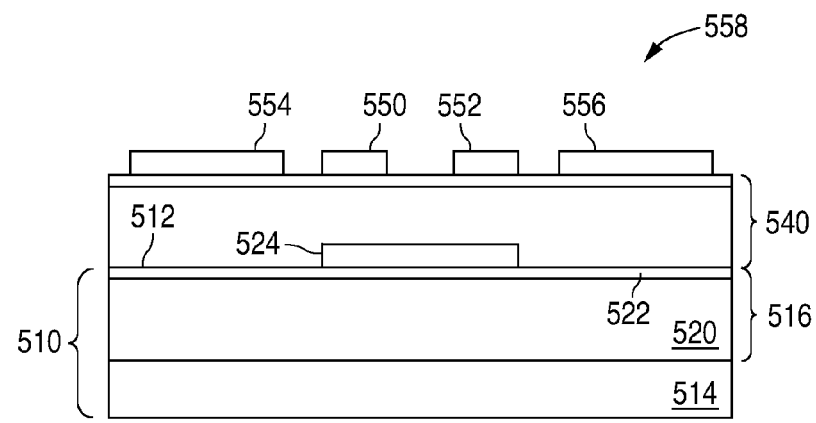
Figure 5J:
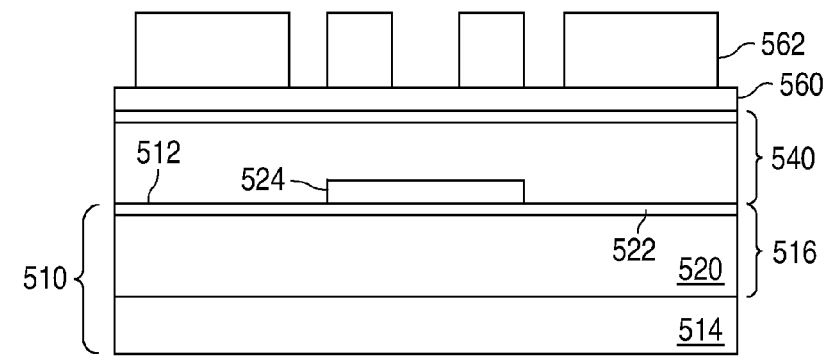
Figure 5K:
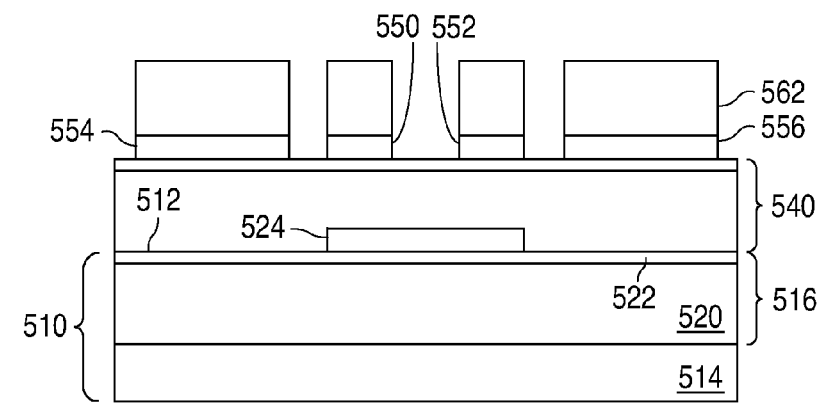
Figure 5L:
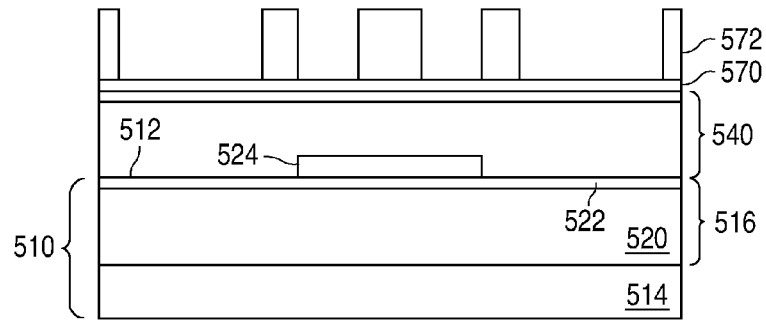
Figure 5M:
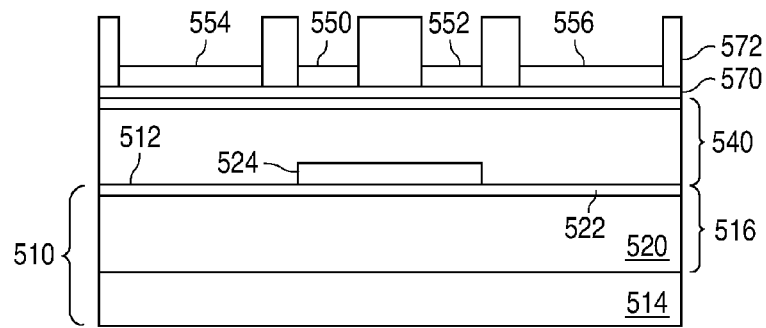
Figure 5N:
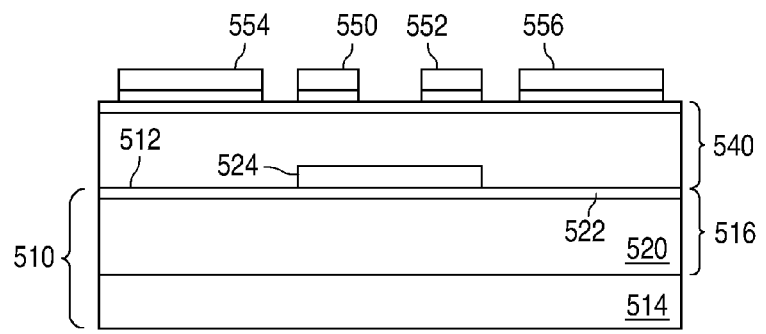
Figure 5O:
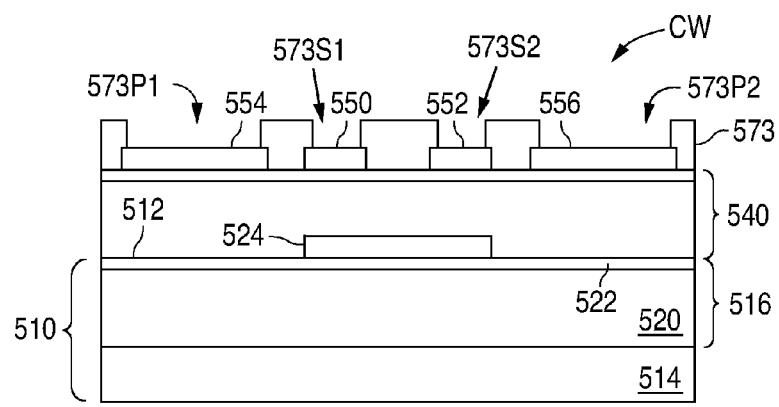
Figure 5P:
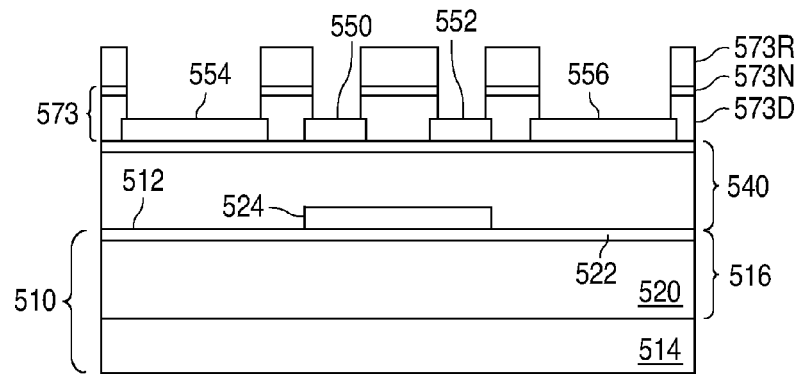
Figure 5Q:
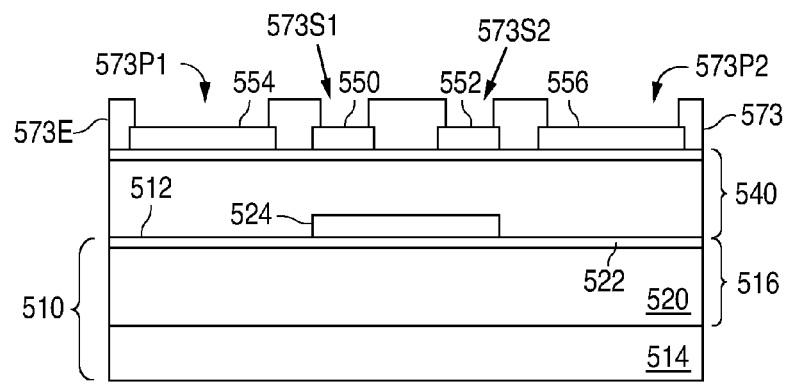
Figure 5R:
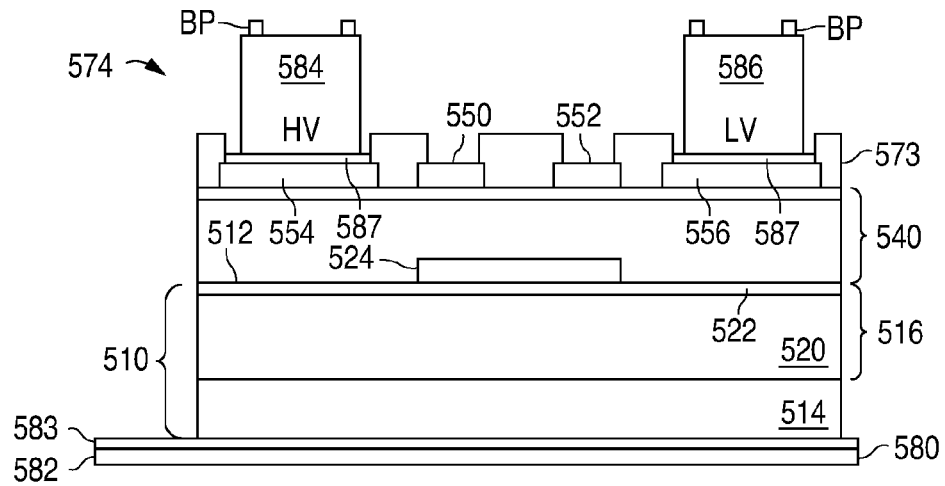
Figure 5S:
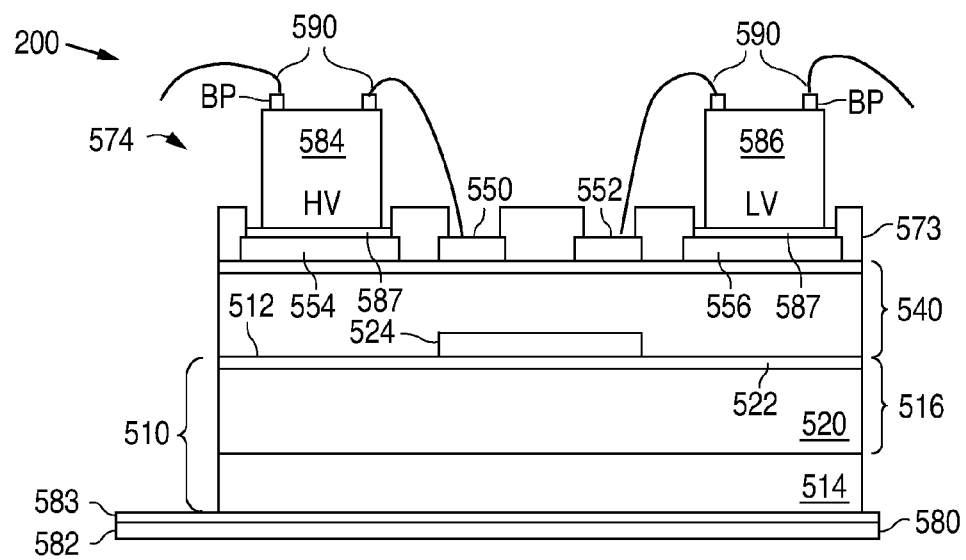
Figure 5T:
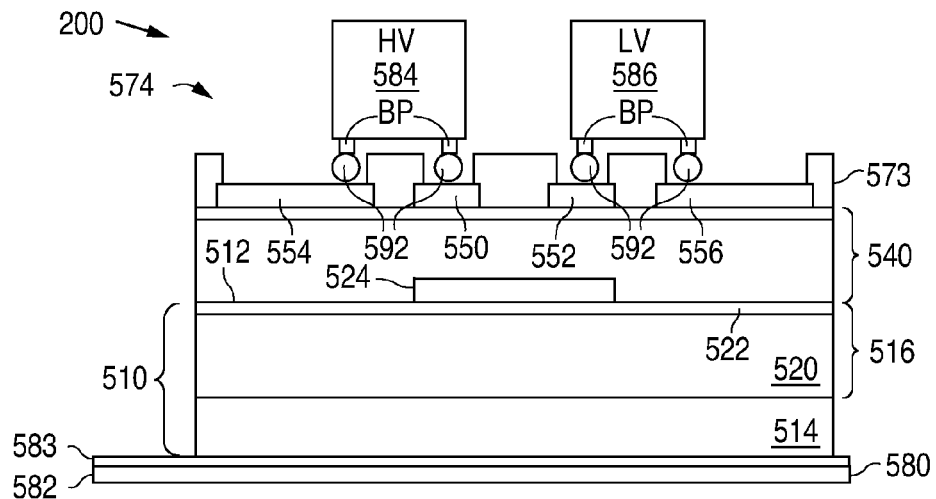
Figure 5U:
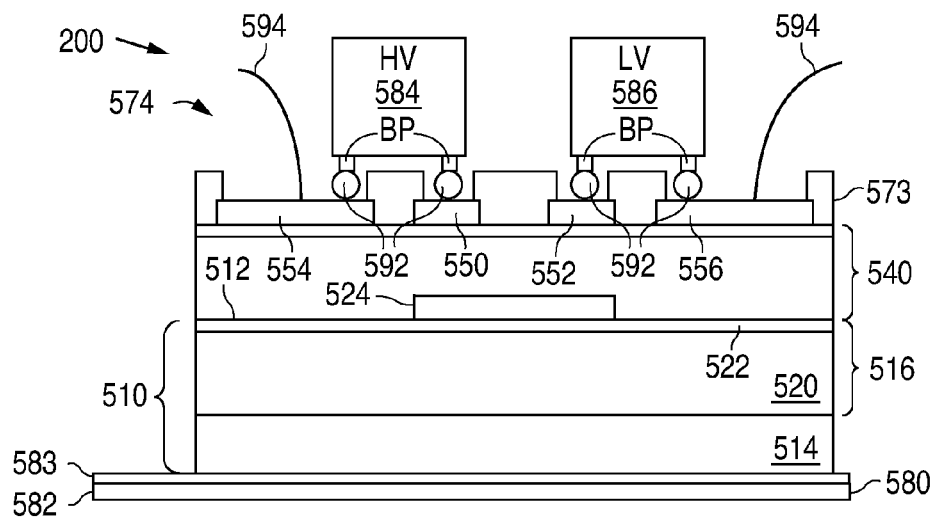

FIGS. 5A-5U show cross-sectional views that illustrate examples of a method 500 of forming multi-die chip 200 in accordance with the present invention. As shown in FIG. 5A, method 500 begins by forming a substrate structure 510 which has a non-conductive top surface 512. In the present example, substrate structure 510 is formed with a conventionally fabricated silicon wafer 514 and an overlying non-conductive layer 516. Silicon wafer 514 can have, for example, a thickness of 750 μm, a diameter of 200 mm, and a resistivity of 10Ω per square centimeter.

As further shown in FIG. 5A, non-conductive layer 516 can be formed by depositing a layer of silicon dioxide 520 on the top surface of silicon wafer 514, followed by the deposition of a layer of silicon nitride 522 on the top surface of oxide layer 520. Oxide layer 520 can be deposited in a conventional manner, such as by chemical vapor deposition using a Novellus Concept One manufactured by Novellus Systems, Inc., of San Jose, Calif., to have a thickness that lies in the approximate range of 5-17 μm.

Silicon nitride layer 522 can also be deposited in a conventional manner to have a thickness of approximately 0.6-1.5 μm thick. (The total thickness of oxide layer 520 and nitride layer 522 is selected to prevent dielectric breakdown.) In addition, other dielectric materials, such as diamond, can also be used, where the thickness is chosen based on the relative dielectric strength compared to oxide.

After the formation of substrate structure 510, a lower plate 524 is formed on the top surface 512 of substrate structure 520. Lower plate 524 can be formed in a number of different ways. As shown in FIG. 5B, in a first embodiment, lower plate 524 can be formed by sputter depositing a metal layer 526, such as aluminum, onto the non-conductive top surface 512 of substrate structure 510 to a depth that lies in the approximate range of 0.5-1.5 μm. Alternately, metal layer 526 can include multiple layers of metal such as, for example, a layer of titanium, a layer of titanium nitride, a layer of aluminum copper, a layer of titanium, and a layer of titanium nitride.

Once metal layer 526 has been formed, a patterned photoresist layer 528 approximately 1.0 μm thick is formed on the top surface of metal layer 526 in a conventional manner. As shown in FIG. 5C, following the formation of patterned photoresist layer 528, metal layer 526 is etched to remove the exposed regions of metal layer 526 and form lower plate 524.

Metal layer 526 can be etched using a dry etch such as reactive ion etching, or a timed wet etch. For example, aluminum can be wet etched in a 10:1 hydrogen fluoride solution for the necessary period of time. After the etch, the resulting structure is rinsed, and patterned photoresist layer 528 is then removed in a conventional manner, such as with acetone. Once patterned photoresist layer 528 has been removed, the resulting structure is conventionally cleaned to remove organics, such as with a Piranha etch (e.g., using a solution of $50H_2SO_4:1H_2O_2$@120° C. removes approximately 240 nm/minute).

Alternately, in a second embodiment, as shown in FIG. 5D, metal lower plate 524 can be formed by depositing a seed layer 530 to touch the non-conductive top surface 512 of substrate structure 510. For example, seed layer 530 can be formed by depositing 300 Å of titanium, 3000 Å of copper, and 300 Å of titanium. Once seed layer 530 has been formed, a plating mold 532 is formed on the top surface of seed layer 530.

As shown in FIG. 5E, following the formation of plating mold 532, copper is electroplated in a conventional manner to form lower plate 524. As shown in FIG. 5F, after the electroplating, plating mold 532 and the underlying regions of seed layer 530 are removed to expose lower plate 524.

As shown in FIG. 5G, after lower plate 524 has been formed, a dielectric layer 540 is formed on lower plate 524 and the non-conductive top surface 512 of substrate structure 510. In the present example, when lower plate 524 is formed as in the first embodiment (metal deposit, mask, and etch), dielectric layer 540 can be formed by depositing a layer of silicon dioxide 542 on the top surface 512 of substrate structure 510, followed by the deposition of a layer of silicon nitride 544 on the top surface of oxide layer 542.

Oxide layer 542 can be deposited in a conventional manner, such as by chemical vapor deposition using a Novellus Concept One, to have a thickness that lies in the approximate range of 5-17 µm. Silicon nitride layer 544 can also be deposited in a conventional manner to have a thickness of approximately 0.6-1.5 µm thick. Alternately, as shown in FIG. 5H, when metal lower plate 524 is formed as in the second embodiment (electroplated), dielectric layer 540 can also include a silicon nitride layer 546 that is conventionally deposited to prevent copper electromigration before oxide layer 542 is deposited.

As shown in FIG. 5I, after dielectric layer 540 has been formed, a high-voltage upper plate 550, a low-voltage upper plate 552, a high-voltage pad 554, and a low-voltage pad 556 are simultaneously formed to touch the top surface of dielectric layer 540. High-voltage upper plate 550, low-voltage upper plate 552, high-voltage pad 554, and low-voltage pad 556 can be simultaneously formed in a number of different ways.

As shown in FIG. 5J, in a first embodiment, the plates 550 and 552 and the pads 554 and 556 can be formed by sputter depositing a metal layer 560, such as aluminum, onto the top surface of dielectric layer 540 to a depth that lies in the approximate range of 0.5-1.5 µm. Alternately, metal layer 560 can include multiple layers of metal such as, for example, a layer of titanium, a layer of titanium nitride, a layer of aluminum copper, a layer of titanium, and a layer of titanium nitride. Once metal layer 560 has been formed, a patterned photoresist layer 562 approximately 1.0 µm thick is formed on the top surface of metal layer 560 in a conventional manner.

As shown in FIG. 5K, following the formation of patterned photoresist layer 562, metal layer 560 is etched to remove the exposed regions of metal layer 560 and form the plates 550 and 552 and the pads 554 and 556. Metal layer 560 can be etched using a dry etch such as a reactive ion etch, or a timed wet etch. For example, aluminum can be wet etched in a solution of phosphoric acid (80%), acetic acid (5%), nitric acid (5%), and water (10%) for the required period of time. After the etch, the resulting structure is rinsed, and patterned photoresist layer 562 is removed in a conventional manner, such as with acetone.

Alternately, in a second embodiment, as shown in FIG. 5L, the plates 550 and 552 and the pads 554 and 556 can be formed by depositing a seed layer 570 to touch the top surface of dielectric layer 540. For example, seed layer 570 can be formed by depositing 300 Å of titanium, 3000 Å of copper, and 300 Å of titanium. Once seed layer 570 has been formed, a plating mold 572 is formed on the top surface of seed layer 570.

As shown in FIG. 5M, following the formation of plating mold 572, copper is electroplated to form the plates 550 and 552 and the pads 554 and 556. As shown in FIG. 5N, after the electroplating, plating mold 572 and the underlying regions of seed layer 570 are removed to expose the plates 550 and 552 and the pads 554 and 556. Optionally, a layer of material, such as aluminum copper, can be deposited and then selectively etched away to form layers that individually cover the plates 550 and 552 and the pads 554 and 556 to enhance bonding wire adhesion for the plates 550 and 552.

After the plates 550 and 552 and the pads 554 and 556 have been formed, as shown in FIG. 5O, a passivation layer 573 is formed on the top surface of dielectric layer 540, the plates 550 and 552, and the pads 554 and 556 to complete the formation of a capacitive wafer CW. As further shown in FIG. 5O, passivation layer 573 is formed to have plate openings 573S1 and 573S2, and pad openings 573P1 and 573P2 that expose the plates 550 and 552 and the pads 554 and 556, respectively.

Passivation layer 573 can be formed in a number of different ways. As shown in FIG. 5P, in a first embodiment, passivation layer 573 can be formed by depositing a layer of silicon dioxide 573D on dielectric layer 540, the plates 550 and 552, and the pads 554 and 556. Following this, a layer of silicon nitride 573N is deposited on the top surface of oxide layer 573D. Oxide layer 573D and silicon nitride layer 573N can be deposited in a conventional manner.

Once nitride layer 573N has been formed, a patterned photoresist layer 573R approximately 1.0 µm thick is formed on the top surface of nitride layer 573N in a conventional manner. Following the formation of patterned photoresist layer 573R, the exposed regions of nitride layer 573N and oxide layer 573D are etched to form passivation layer 573 with plate openings 573S1 and 573S2 and the pad openings 573P1 and 573P2 that expose the plates 550 and 552 and the pads 554 and 556, respectively. Patterned photoresist layer 573P is then removed in a conventional manner.

Alternately, in a second embodiment, as shown in FIG. 5Q, passivation layer 573 can be formed by depositing an epoxy layer 573E, such as SU-8, on dielectric layer 540, the plates 550 and 552, and the pads 554 and 556. Epoxy layer 573E is then exposed with a pattern and cured to form passivation layer 573 with the plate openings 573S1 and 573S2 and the pad openings 573P1 and 573P2.

After capacitive wafer CW has been formed (following the formation of passivation layer 573 with the plate openings 573S1 and 573S2 and the pad openings 573P1 and 573P2), the back side of capacitive wafer CW can be ground down as necessary so that the completed assembly can fit into a package.

Following this, as shown in FIG. 5R, the capacitive wafer CW is diced to form a large number of capacitive die 574. After capacitive wafer CW has been diced, a capacitive die 574 is physically connected to a DAP 580 of a lead frame 582 that only has a single DAP using a conventional pick-and-place machine. Capacitive die 574 can be physically connected to DAP 580 using an adhesive 583 such as, for example, a conductive or non-conductive epoxy or die attach film.

After capacitive die 574 has been connected to DAP 580, a high-voltage die 584 is connected to high-voltage pad 554, and a low-voltage die 586 is connected to low-voltage pad 556 using a conventional pick-and-place machine. High-voltage die 584 and low-voltage die 586 each have a number of bond pads BP that provide points of external electrical connections for die 584 and die 586. High-voltage die 584 can be physically connected to high-voltage pad 554, and low-voltage die 586 can be physically connected to low-voltage pad 556 using an adhesive 587 such as, for example, a conductive or non-conductive epoxy or die attach film.

As shown in FIG. 5S, after high-voltage die 584 has been physically connected to high-voltage pad 554, and low-voltage die 586 has been physically connected to low-voltage pad 556, one or more bond pads BP on high-voltage die 584 is conventionally electrically connected to high-voltage plate 550 by one or more bonding wires 590.

In addition, one or more bond pads BP on low-voltage die 586 is conventionally electrically connected to low-voltage plate 552 by one or more bonding wires 590. Further, high-voltage die 584 and low-voltage die 586 are each electrically connected to pad contacts on lead frame 582 by bonding wires

590. The resulting structure is then encapsulated in a conventional manner to form galvanically-isolated multi-die chip 200.

Alternately, as shown in FIG. 5T, to reduce the parasitics associated with the bonding wires 590, the bond pads BP on high-voltage die 584 can be physically and electrically connected to high-voltage plate 550 and high-voltage pad 554, and the bond pads BP on low-voltage die 586 can be physically and electrically connected to low-voltage plate 552 and low-voltage pad 556, as flip chips with solder balls 592 in a conventional manner.

As shown in FIG. 5U, after the bond pads BP on high-voltage die 584 have been connected to high-voltage pad 554, and the bond pads BP on low-voltage die 586 have been connected to low-voltage pad 556 with solder balls 592, high-voltage die 584 and low-voltage die 586 are each conventionally electrically connected to pad contacts on lead frame 582 by bonding wires 594. The resulting structure is then encapsulated in a conventional manner to form galvanically-isolated multi-die chip 200.

The sequence of attaching capacitive die 574 to DAP 580, and high-voltage die 584 and low-voltage die 586 to capacitive die 574 is arbitrary. Thus, high-voltage die 584 can be connected to high-voltage pad 554, and low-voltage die 586 can be connected to low-voltage pad 556 before capacitive die 574 is connected to DAP 580.

FIGS. 6A-6D show cross-sectional views that illustrate an example of a method 600 of forming multi-die chip 300 with deposited metal in accordance with the present invention. FIGS. 7A-7D show cross-sectional views that illustrate an example of a method 700 of forming multi-die chip 300 with electroplated metal in accordance with the present invention. Methods 600 and 700 are the same as method 500 up through the formation of dielectric layer 540, and first differ from method 500 in that a via is formed before the plates 550 and 552 and pads 554 and 556 are formed.

Figure 6A:
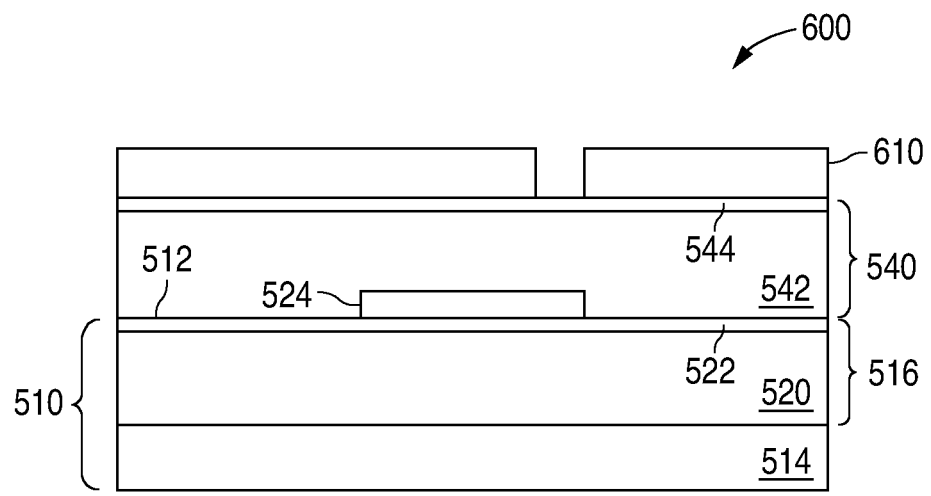
FIGS. 6A-6D are cross-sectional views illustrating an example of a method 600 of forming multi-die chip 300 with deposited metal in accordance with the present invention.
Figure 7A:
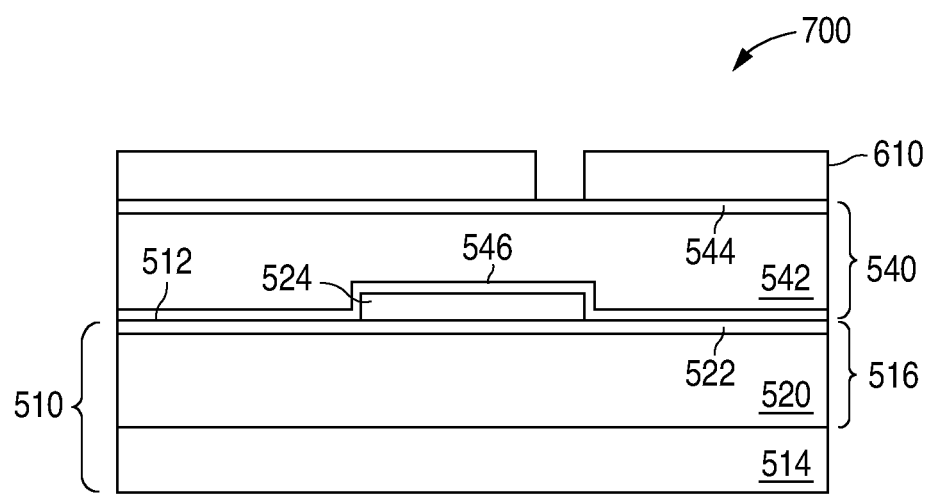
FIGS. 7A-7D are cross-sectional views illustrating an example of a method 700 of forming multi-die chip 300 with electroplated metal in accordance with the present invention.
Figure 6B:
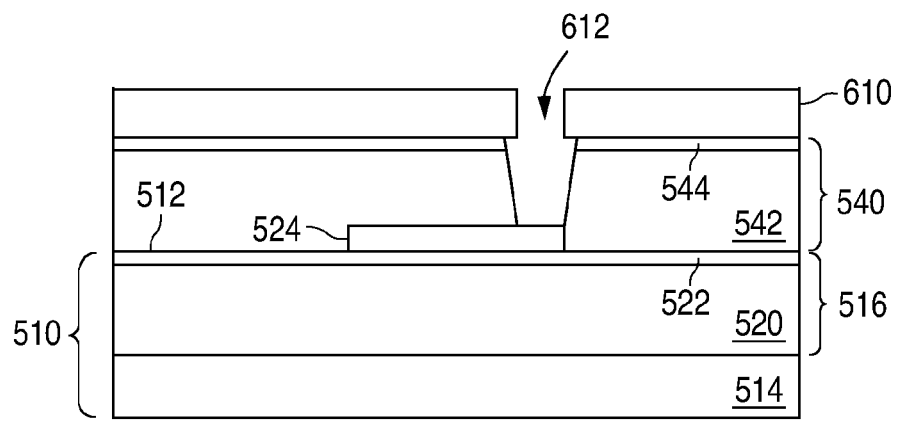
Figure 7B:
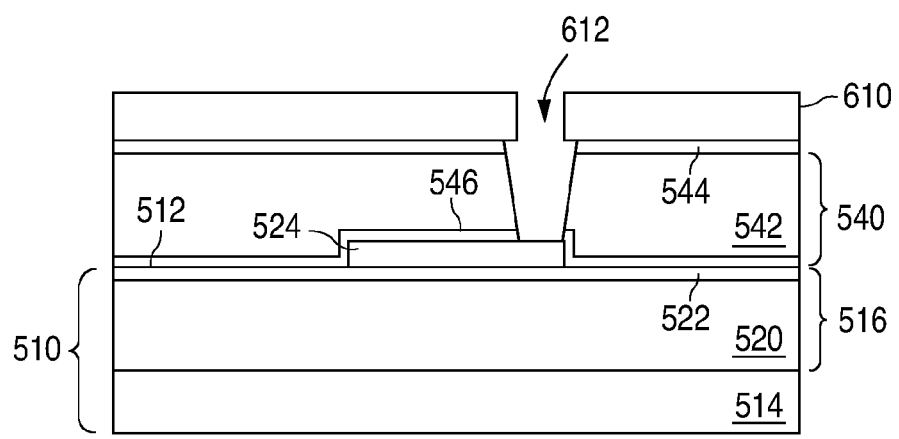

As shown in FIGS. 6A and 7A, after dielectric layer 540 has been formed, a patterned photoresist layer 610 approximately 1.0 μm thick is formed on the top surface of dielectric layer 540 in a conventional manner. As shown in FIGS. 6B and 7B, following the formation of patterned photoresist layer 610, dielectric layer 540 is etched to form an opening 612 that exposes a portion of the top surface of lower plate 524. In the present example, opening 612 has angled non-vertical side walls. After the etch, the resulting structure is rinsed, and patterned photoresist layer 610 is removed in a conventional manner, such as with acetone.

Figure 6C:
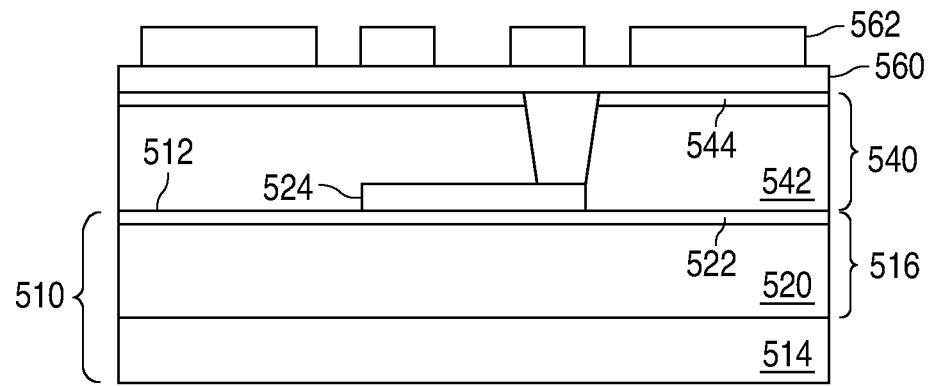

After opening 612 has been formed, a via can be formed in opening 612 at the same time that the plates 550 and 552 and pads 554 and 556 are formed in a number of different ways. For example, as shown in FIG. 6C, after patterned photoresist layer 610 has been removed, metal layer 560 is sputter deposited onto the top surface of dielectric layer 540 as before, but now also fills up opening 612.

Figure 6D:
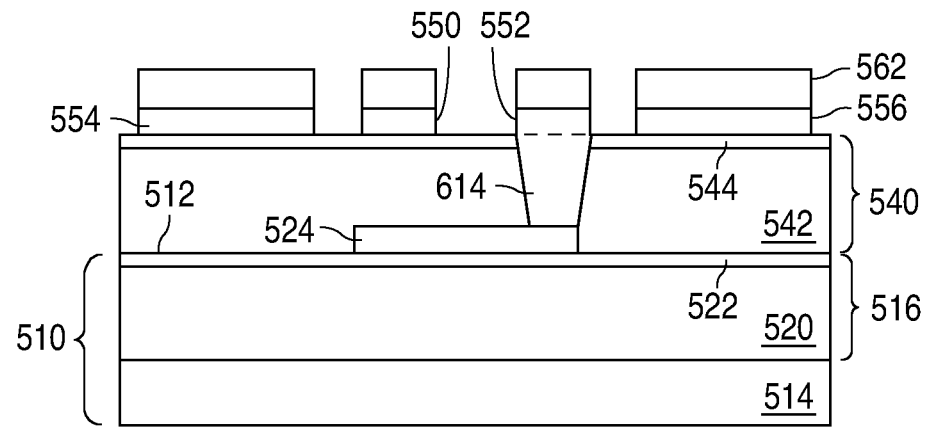

Once metal layer 560 has been formed, patterned photoresist layer 562 is formed on the top surface of metal layer 560 as before. As shown in FIG. 6D, the exposed regions of metal layer 560 are then etched to form the plates 550 and 552 and pads 554 and 556, along with a via 614 that extends through dielectric layer 540 to electrically connect lower plate 524 to low-voltage upper plate 552. Method 600 then continues as in method 500. (Alternately, a metal layer can be deposited to fill up opening 612, and then planarized to form via 614. The plates 550 and 552 and pads 554 and 556 can then be formed as described in FIGS. 5A-5Q.)

Figure 7C:
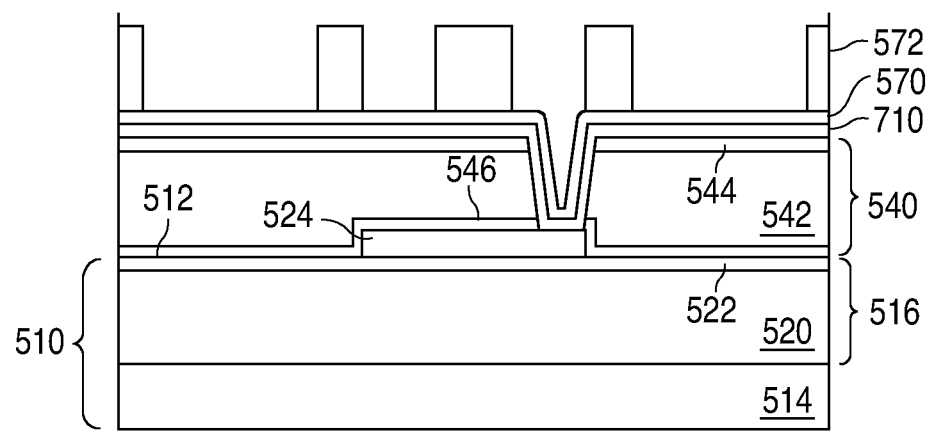

A via can also be formed in opening 612 at the same time that the plates 550 and 552 and pads 554 and 556 are formed in an electroplating process. For example, as shown in FIG. 7C, after patterned photoresist layer 610 has been removed, a conductive barrier layer 710 for preventing copper electromigration, such as a layer of tantalum nitride, is deposited on dielectric layer 540 to conformally line opening 612. (Alternately, a layer of silicon nitride can be deposited and then selectively etched away to leave a silicon nitride layer that lines the side walls of opening 612 and exposes lower plate 524.)

Figure 7D:
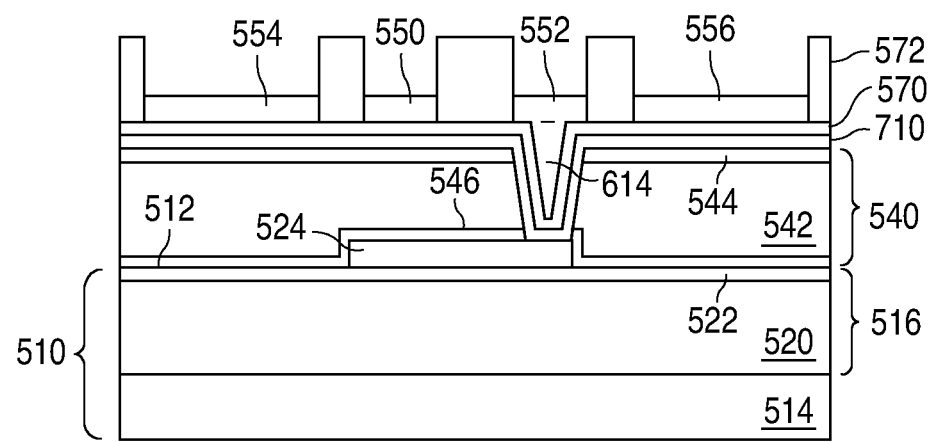

Following this, seed layer 570 is formed on the top surface of barrier layer 710. Once seed layer 570 has been formed, plating mold 572 is formed on the top surface of seed layer 570. As shown in FIG. 7D, following the formation of plating mold 572, copper is electroplated to form the plates 550 and 552 and the pads 554 and 556, and via 614. Method 700 then continues as in method 500, except that the exposed portion of barrier layer 710 is removed after the exposed portion of seed layer 570 has been removed.

Multi-die chip 400 can be formed by modifying methods 500, 600, and 700. For example, the lower metal plates 410 and 412 can be formed by modifying patterned photoresist layer 528 shown in FIGS. 5B and 5C to form two lower plates in lieu of lower plate 524. Alternately, plating mold 532 shown in FIGS. 5D and 5E can be modified to have two openings instead of only one. In addition, vias 414 and 416 can be formed in the same manner that via 614 was formed.

Thus, a galvanically-isolated, multi-die chip and a method of forming the chip have been described. One of the advantages of the present invention is that by forming a galvanically-isolated system on a single die, a lead frame with only a single PAD can be utilized which, in turn, reduces the size of the resulting chip.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A galvanically-isolated semiconductor structure comprising:
    a substrate structure having a bottom surface and a top surface, the top surface being completely non-conductive such that no conductive structure both lies above the top surface and touches a conductive region that touches and lies below the top surface;
    a lower plate that touches the non-conductive top surface of the substrate structure, the lower plate being metal;
    a dielectric layer that touches the lower plate and the non-conductive top surface of the substrate structure, the dielectric layer having a top surface;
    a high-voltage upper plate that touches the top surface of the dielectric layer, the high-voltage upper plate being metal and lying directly vertically over a portion of the lower plate; and
    a high-voltage pad that touches the top surface of the dielectric layer, the high-voltage pad being spaced apart from the high-voltage upper plate.

2. The galvanically-isolated semiconductor structure of claim 1 wherein the lower plate is electrically isolated from all other conductive structures.

3. The galvanically-isolated semiconductor structure of claim 1 and further comprising a high-voltage die connected to the high-voltage pad, the high-voltage die having a plurality of bond pads.

4. The galvanically-isolated semiconductor structure of claim 3 and further comprising a bonding wire that touches the high-voltage upper plate and a bond pad on the high-voltage die.

5. The galvanically-isolated semiconductor structure of claim 3 and further comprising a solder ball that touches a bond pad of the plurality of bond pads and the high-voltage upper plate.

6. The galvanically-isolated semiconductor structure of claim 1 and further comprising a low-voltage upper plate that touches the top surface of the dielectric layer, the low-voltage upper plate being metal, and being spaced apart from the high-voltage upper plate and the high-voltage pad.

7. The galvanically-isolated semiconductor structure of claim 6 and further comprising a low-voltage pad that touches the top surface of the dielectric layer, the low-voltage pad being metal and spaced apart from the high-voltage upper plate, the high-voltage pad, and the low-voltage plate.

8. The galvanically-isolated semiconductor structure of claim 7 wherein the low-voltage upper plate lies directly vertically over a portion of the lower plate.

9. The galvanically-isolated semiconductor structure of claim 8 and further comprising:
 a high-voltage die connected to the high-voltage pad, the high-voltage die having a plurality of bond pads; and
 a low-voltage die connected to the low-voltage pad, the low-voltage die having a plurality of bond pads.

10. The galvanically-isolated semiconductor structure of claim 9 and further comprising a bonding wire connected to the high-voltage upper plate and a bond pad on the high-voltage die, and a bonding wire connected to the low-voltage upper plate and a bond pad on the low-voltage die.

11. The galvanically-isolated semiconductor structure of claim 9 and further comprising:
 a first solder ball that touches the high-voltage upper plate and a bond pad of the plurality of bond pads of the high-voltage die; and
 a second solder ball that touches the low-voltage upper plate and a bond pad of the plurality of bond pads of the low-voltage die.

12. The galvanically-isolated semiconductor structure of claim 9 and further comprising a lead frame, the lead frame having a single die attach pad, the bottom surface of the substrate structure being physically connected to the single die attach pad.

13. The galvanically-isolated semiconductor structure of claim 7 and further comprising:
 a lower structure that touches the non-conductive top surface of the substrate structure, and lies laterally adjacent to and spaced apart from the lower plate, the lower structure being metal;
 a first via that extends through the dielectric layer to touch the lower plate and the high-voltage upper plate, the first via being metal; and
 a second via that extends through the dielectric layer to touch the lower plate and the low-voltage upper plate, the second via being metal.

14. The galvanically-isolated semiconductor structure of claim 8 and further comprising a conductive via that extends through the dielectric layer to touch the lower plate and low-voltage upper plate.

15. The galvanically-isolated semiconductor structure of claim 14 and further comprising:
 a high-voltage die connected to the high-voltage pad, the high-voltage die having a plurality of bond pads; and
 a low-voltage die connected to the low-voltage pad, the low-voltage die having a plurality of bond pads.

16. The galvanically-isolated semiconductor structure of claim 15 and further comprising a bonding wire connected to the high-voltage upper plate and a bonding pad on the high-voltage die, and a bonding wire connected to the low-voltage upper plate and a bonding pad on the low-voltage die.

17. The galvanically-isolated semiconductor structure of claim 14 and further comprising a conductive via that extends through the dielectric layer to touch the lower plate and high-voltage upper plate.

18. The galvanically-isolated semiconductor structure of claim 17 and further comprising:
 a high-voltage die connected to the high-voltage pad, the high-voltage die having a plurality of bonding pads; and
 a low-voltage die connected to the low-voltage pad, the low-voltage die having a plurality of bonding pads.

19. A galvanically-isolated semiconductor structure comprising:
 a substrate structure having a bottom surface and a top surface;
 a lower plate that touches the top surface of the substrate structure, the lower plate being metal;
 a dielectric layer that touches the lower plate and the top surface of the substrate structure, the dielectric layer having a top surface;
 a high-voltage upper plate that touches the top surface of the dielectric layer, the high-voltage upper plate being metal and lying directly vertically over a portion of the lower plate;
 a high-voltage pad that touches the top surface of the dielectric layer, the high-voltage pad being spaced apart from the high-voltage upper plate;
 a high-voltage die connected to the high-voltage pad, the high-voltage die having a plurality of bonding pads; and
 a bonding wire connected to the high-voltage upper plate and a bonding pad on the high-voltage die.

20. A method of forming a galvanically-isolated semiconductor structure comprising:
 forming a lower plate to touch a top surface of a substrate structure, the lower plate being metal, the top surface being completely non-conductive such that no conductive structure both lies above the top surface and touches a conductive region that touches and lies below the top surface;
 forming a dielectric layer to touch the lower plate and the non-conductive top surface of the substrate structure, the dielectric layer having a top surface;
 forming a plurality of upper metal structures that touch the top surface of the dielectric layer, the plurality of upper metal structures including a high-voltage upper plate that lies directly vertically over a portion of the lower plate, and a high-voltage pad spaced apart from the high-voltage upper plate.

\* \* \* \* \*